United States Patent
Memishian

(10) Patent No.: US 9,236,880 B2
(45) Date of Patent: Jan. 12, 2016

(54) HIGH RESOLUTION ANALOG TO DIGITAL CONVERTER

(71) Applicant: Analog Devices, Inc., Norwood, MA (US)

(72) Inventor: John Memishian, Weston, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 14/680,271

(22) Filed: Apr. 7, 2015

(65) Prior Publication Data

US 2015/0288378 A1    Oct. 8, 2015

Related U.S. Application Data

(60) Provisional application No. 61/977,020, filed on Apr. 8, 2014.

(51) Int. Cl.
*H03M 1/00* (2006.01)
*H03M 1/44* (2006.01)

(52) U.S. Cl.
CPC .............. *H03M 1/442* (2013.01); *H03M 1/002* (2013.01)

(58) Field of Classification Search
CPC ... H03M 1/0682; H03M 1/12; H03M 1/1245; H03M 1/38; H03M 1/40; H03M 1/44; H03M 1/468; H03M 1/02; H03M 1/1205; H03M 1/007
USPC .......................................... 341/122, 155, 172
See application file for complete search history.

(56) References Cited

U.S. PATENT DOCUMENTS

| | | | | | |
|---|---|---|---|---|---|
| 5,461,381 | A | * | 10/1995 | Seaberg | H03M 3/37 341/143 |
| 5,581,252 | A | * | 12/1996 | Thomas | H03M 1/466 341/144 |
| 5,703,589 | A | * | 12/1997 | Kalthoff | H03M 3/34 341/118 |
| 5,739,720 | A | * | 4/1998 | Lee | G11C 27/026 330/51 |
| 6,445,331 | B1 | * | 9/2002 | Stegers | G06G 7/1865 327/337 |
| 6,630,898 | B1 | * | 10/2003 | Stegers | H03K 5/249 341/143 |
| 6,674,386 | B2 | * | 1/2004 | Carreau | H03M 1/1004 341/155 |
| 7,199,745 | B2 | * | 4/2007 | Tachibana | H03M 1/468 341/155 |
| 7,439,889 | B2 | * | 10/2008 | Fujimoto | H03M 1/0836 341/120 |
| 7,515,086 | B2 | * | 4/2009 | Ryu | H03M 1/06 341/144 |
| 8,711,024 | B2 | * | 4/2014 | Sabut | H03F 3/005 341/155 |
| 8,860,599 | B1 | * | 10/2014 | Lien | H03M 1/34 341/155 |

* cited by examiner

*Primary Examiner* — Linh Nguyen
(74) *Attorney, Agent, or Firm* — Ropes & Gray LLP

(57) ABSTRACT

The systems, methods, and devices disclosed herein relate to a bit-per-stage ADC. The bit-per-stage ADC extracts one or more bits at each stage and creates a residue so that succeeding similar or identical stages can extract more bits. The ADC uses a reflected binary output code so that a bit can be extracted by observing the sign (e.g., polarity) of an input. The residue can be generated by rectifying the input, multiplying it by two, and level-shifting it by half the span. The generation of the residue is achieved using capacitors and switches. This causes the ADC to have low power consumption and a small size.

20 Claims, 7 Drawing Sheets

HIGH RESOLUTION ANALOG TO DIGITAL CONVERTER

CROSS REFERENCE TO RELATED APPLICATIONS

This application claims the benefit of priority under 35 U.S.C. §119(e) from U.S. Provisional Application Ser. No. 61/977,020, filed Apr. 8, 2014, the content of which is hereby incorporated herein by reference in its entirety.

TECHNICAL FIELD

This disclosure relates to systems and methods for analog to digital conversion.

BACKGROUND

Analog to digital converters (ADCs) convert an analog voltage input to a digital output, usually in binary code, at a certain sampling rate. ADCs have been implemented using various architectures including successive approximation, Sigma Delta, and bit-per-stage architectures. ADCs are commonly characterized by their resolution (the number of output levels, expressed in bits, to which they can quantize a signal), and their sampling rate.

In certain applications, it is necessary to increase the resolution of conventional analog-to-digital converters (ADCs) while maintaining a small size. In particular, maintaining a small size can be important in embedded applications, such as for ADCs embedded in accelerometers or micropower impact sensors. It is also desirable for an ADC to provide low power consumption and a variable resolution (e.g., a variable number of output bits).

It is difficult to increase the resolution of existing successive approximation analog-to-digital converters because such converters are already relatively large and would need to be enlarged further to accommodate 14 or more bits. Furthermore, additional trimming features may be required beyond 13 bits. Sigma-delta ADCs provide higher resolution, but at the expense of higher power consumption. Additionally, sigma-delta converters cannot usually be multiplexed. Binary bit-per-stage ADCs produce residue output signals with discontinuities corresponding to the points where the comparator changes state and causes a DAC to switch. These discontinuities in the residue output waveforms are a fundamental problem with such an architecture. Adequate settling time must be allowed for these transients to propagate through a stage and settle at the final comparator input, and as a result, it is difficult to make these architectures operate at high speeds.

Folding bit-per-stage ADCs avoid the discontinuity problems of the binary bit-per-stage architectures. F. D. Waldhauer presents an implementation of the folding architecture in U.S. Pat. No. 3,187,325. Waldhauer's implementation of the folding transfer function uses solid state operational amplifiers with diodes in the feedback loop. However, the Waldhauer implementation is best suited to low resolution applications because it has various independent error sources. For example, a cascade of Waldhauer's stages suffers from independent errors in every stage. Additionally, the Waldhauer implementation exhibits high power consumption. Therefore, there remains a need for ADCs that provide high resolution (e.g., 12 bits or more) while having low power consumption and a small size. Furthermore, there is a need for small low-power ADCs that have variable resolution.

SUMMARY

Systems, methods, and devices for analog-to-digital conversion are described herein. The systems, methods, and devices disclosed herein relate to a bit-per-stage ADC. The bit-per-stage ADC extracts one or more bits at each stage and creates a residue so that succeeding similar or identical stages can extract more bits. The ADC uses a reflected binary output code so that a bit can be extracted by observing the sign (e.g., polarity) of an input. The residue can be generated by rectifying the input, multiplying it by two, and level-shifting it by half the span. In one aspect, a method for analog to digital conversion includes charging a first capacitor and a second capacitor with an input voltage, each capacitor having a first and a second plate, connecting a first reference voltage to the second plate of the first capacitor, connecting a second reference voltage to the first plate of the second capacitor, determining, using a comparator, a polarity of an output voltage, wherein the output voltage is a voltage difference between the first plate of the first capacitor and the second plate of the second capacitor, outputting a binary bit representing the polarity, and switching the polarity of the output voltage based on the binary bit to rectify the output voltage.

In some embodiments, a first output terminal is connected to the first plate of the first capacitor and a second output terminal is connected to the second plate of the second capacitor. In such cases, rectifying includes switching connections to the first output terminal and the second output terminal based on the binary bit. In certain embodiments, rectifying includes, if the polarity is positive, connecting the first output terminal to the second plate of the second capacitor and connecting the second output terminal to the first plate of the first capacitor, and, if the polarity is negative, connecting the second output terminal to the second plate of the second capacitor and connecting the first output terminal to the first plate of the first capacitor. In some embodiments, the method also includes recirculating a residue by connecting the first and second output terminals to the positive and negative input terminals. In certain embodiments, a voltage difference between the first reference voltage and the second reference voltage is equal to a half scale voltage.

In some embodiments, the step of connecting the first reference voltage to the second plate of the first capacitor and the step of connecting the second reference voltage to the first plate of the second capacitor are performed simultaneously. In certain embodiments, the method is repeated to extract 14 bits or more before changing the input voltage. In some embodiments, the input voltage is a differential voltage centered around a common mode voltage. In certain embodiments, the first reference voltage and the second reference voltage are supplied by a third capacitor and a fourth capacitor, respectively. In some embodiments, a capacitance of the first capacitor is not equal to a capacitance of the second capacitor.

In another aspect, a system for analog to digital conversion includes a first capacitor and a second capacitor, each capacitor having a first plate and a second plate, a positive input terminal and a negative input terminal, the positive and negative input terminals being configured to charge the first capacitor and the second capacitor with an input voltage, a first reference voltage source switchably connected to the second plate of the first capacitor, a second reference voltage source switchably connected to the first plate of the second capacitor, a comparator connected to the first plate of the first capacitor and the second plate of the second capacitor, and having a comparator output, and a first and a second output terminal, each terminal being switchably connected to the first plate of the first capacitor and to the second plate of the second capacitor, the switchable connections of the terminals being controlled by the comparator output.

In some embodiments, the switchable connections of the terminals are configured to, if the polarity is positive, electrically couple the first output terminal to the second plate of the second capacitor and electrically couple the second output terminal to the first plate of the first capacitor, and, if the polarity is negative, electrically couple the second output terminal to the second plate of the second capacitor and electrically couple the first output terminal to the first plate of the first capacitor. In certain embodiments, the first and second output terminals are connected to the positive and negative input terminals, respectively. In some embodiments, a voltage difference between the first reference voltage source and the second reference voltage source is equal to a half scale voltage. In certain embodiments, the first reference voltage source includes a third capacitor, and the second reference voltage source includes a fourth capacitor. In some embodiments, a capacitance of the first capacitor is not equal to a capacitance of the second capacitor.

In another aspect, a system for analog to digital conversion includes a first capacitor and a second capacitor, each capacitor having a first and a second plate, means for charging the first capacitor and the second capacitor with an input voltage, means for connecting a first reference voltage to the second plate of the first capacitor, means for connecting a second reference voltage to the first plate of the second capacitor, means for determining a polarity of an output voltage, wherein the output voltage is a voltage difference between the first plate of the first capacitor and the second plate of the second capacitor, means for outputting a binary bit representing the polarity, and means for rectifying the voltage difference of the output voltage based on the binary bit.

In some embodiments, the means for rectifying includes means for, if the polarity is positive, connecting the first output terminal to the second plate of the second capacitor and connecting the second output terminal to the first plate of the first capacitor, and, if the polarity is negative, connecting the second output terminal to the second plate of the second capacitor and connecting the first output terminal to the first plate of the first capacitor. In certain embodiments, the system also includes means for recirculating a residue by connecting the first and second output terminals to the positive and negative input terminals. In some embodiments, the first reference voltage and the second reference voltage are supplied by a third capacitor and a fourth capacitor, respectively.

In some embodiments, a single stage is used to extract multiple bits using recirculation of a residue. The recirculation may be supported by using two cells in alternation, each serving as the hold for the other. In certain embodiments, a sample and hold or a track and hold is used to store the recirculating residue between conversion stages. The variable length ADC can have a smaller size than conventional analog-to-digital converters.

In certain embodiments, the ADC can be implemented as a straight cascade of stages.

In some embodiments, the size of the variable length analog-to-digital converter does not increase proportionately as number of bits of resolution increases.

In certain embodiments, all of the limited number of error sources is applied to every bit, so one set of trim values are required to correct the overall accuracy.

In some embodiments, the variable length analog-to-digital converter includes switches and capacitors which may cause the analog-to-digital converter to have a low temperature coefficient and a wide clock range.

In certain embodiments, each conversion takes a few microseconds.

BRIEF DESCRIPTION OF THE DRAWINGS

The above and other features of the present disclosure, including its nature and its various advantages, will be more apparent upon consideration of the following detailed description, taken in conjunction with the accompanying drawings in which.

Like reference numbers and designations in the various drawings indicate like elements.

DETAILED DESCRIPTION

The following description discloses a design for a low power bit-per-stage analog to digital converter (ADC). The ADC may implement a folding bit-per-stage converter that extracts a bit from an input by measuring and determining the polarity of the input and then outputs a residue that can be used by an identical stage to determine subsequent bits. The ADC can be implemented using a compact recirculating design that reduces the size of the ADC relative to conventional ADCs. A recirculating implementation can allow the resolution of the ADC to be variable. For example, the ADC can allow more bits to be extracted from an input by recirculating a residue for additional cycles and may require no change in circuitry. A cascading design is also envisioned which can provide higher throughput while maintaining low power consumption.

Figure 1:
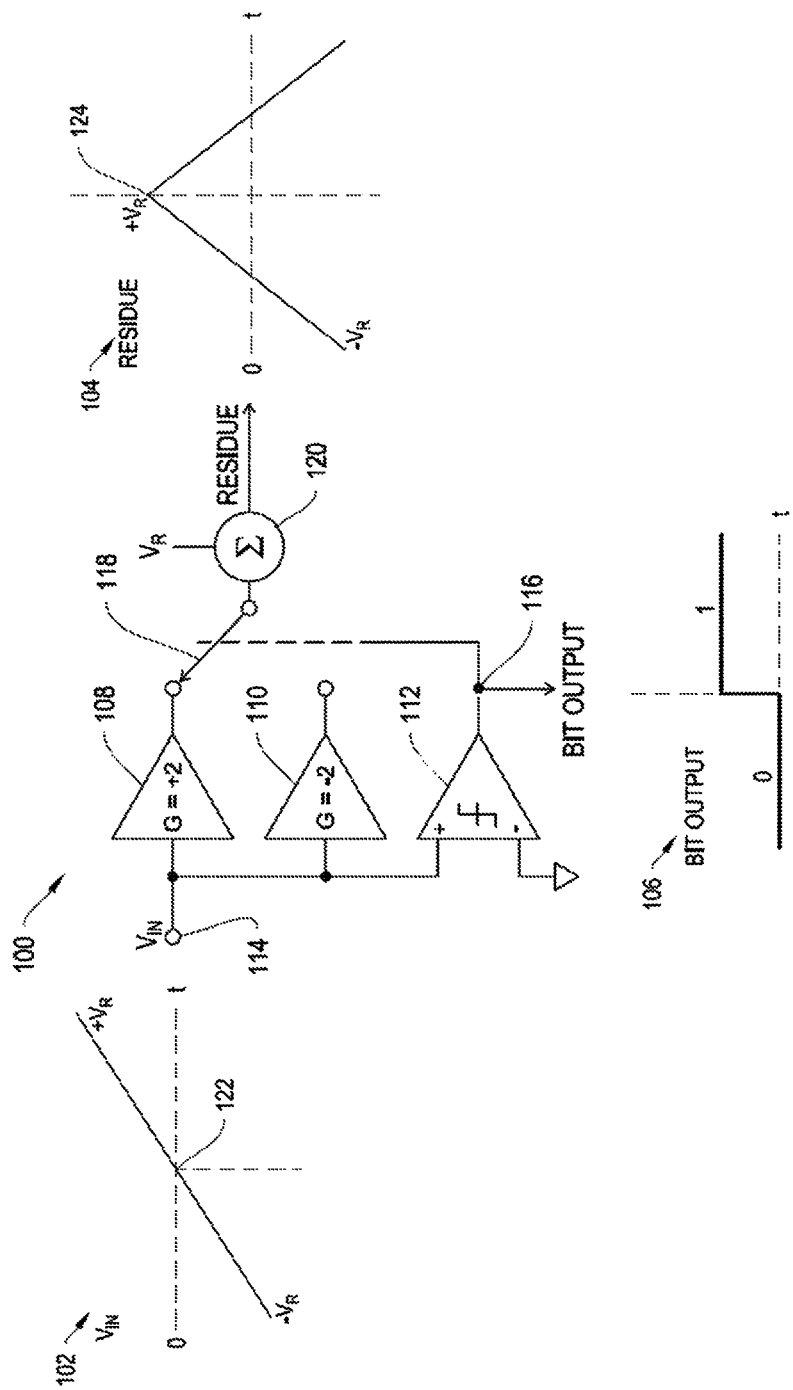
FIG. 1 shows an illustrative stage of a bit-per-stage analog to digital converter (ADC) and corresponding input, residue, and bit output.

FIG. 1 depicts an illustrative stage 100 of a bit-per-stage ADC. Stage 100 includes input node 114, gains 108 and 110, comparator 112, switch 118, summer 120, and bit output node 116. Stage 100 may receive an input signal, such as input 102, and generate a residue and a bit output, such as the depicted residue 104 and bit output 106. Stage 100 uses a folding architecture to convert an analog input into a series of bits digitally representing the analog input. To this end, the stage 100 determines the polarity of its input 102 to produce a bit output 106 and transforms the input 102 into the residue 104. The residue 104 is then sent to the input of an identical stage, which in some embodiments includes sending the residue to its own input. This next stage determines the next bit output. This iterative process of determining a bit from the polarity of the input and passing a residue to the next stage is repeated until the desired number of bits is obtained. Each stage generates its residue from its input by rectifying, doubling, and shifting its input. For simplicity, the doubling and shifting operations are depicted in FIG. 1 as being performed by gains 108 and 110 and a summer 120. However, as will be shown in FIG. 3, these components represent combinations of capacitors and switches that are used to perform the gain and sum operations. The use of capacitors and switches rather than op-amps in the stage 100 eliminates several error sources associated with op-amps while reducing power consumption.

In operation, an input voltage, $V_{IN}$, is connected to node 114 and is compared to ground at comparator 112. The output of the comparator at node 116 is the bit output of the stage 100. A logical zero is output for negative voltages with respect to ground and a logical one is output for positive voltages with respect to ground. Thus, the comparator 112 detects the polarity of the input signal, $V_{IN}$, and provides a corresponding bit output for the stage 100. The output of the comparator 112 is also used to control switch 118. When the output at node 116 is a logical zero, switch 118 connects the output of gain 108 to summer 120. Conversely, when the output at 116 is a logical one, switch 118 connects the output of gain 110 to summer 120. Thus, the polarity of the input voltage determines whether the overall stage gain is +2 or −2. As illustrated in FIG. 1, switch 118 is in a position corresponding to a negative input voltage. At summer 120, the output of gain 108 or gain 110 is added to $V_R$ and the output of the summer is the residue of the stage. The transfer function of stage 100 is thus:

$$\text{Residue} = -2|V_{IN}| + V_R$$

If there are one or more stages after stage 100, the residue signal is passed to the next stage.

Graph 102 shows an example voltage input, $V_{IN}$, to stage 100, while graphs 104 and 106 show the corresponding residue and bit output, respectively. The x-axis of graph 102 shows time, and the y-axis shows voltage. To illustrate the functioning of stage 100, the input is a linear ramp voltage whose range is between $-V_R$ and $+V_R$. The voltage input is initially negative and becomes positive at time 122. Before time 122, comparator 116 outputs a logical zero as shown in graph 106. Also, gain 108 is connected to summer 120 so the residue is $2V_{IN}+V_R$. At time 122, $V_{IN}$ transitions from being negative to positive. As a result, the bit output at 116 transitions from 0 to 1, and switch 118 connects gain 110 to summer 120. In this configuration, the residue is $-2V_{IN}+V_R$. It is worth noting that, unlike in straight binary ripple ADCs, this transition does not result in a jump discontinuity in the residue because at $V_{in}=0$, $$2V_{IN}+V_R = -2V_{IN}+V_R = V_R$$

Figure 2:
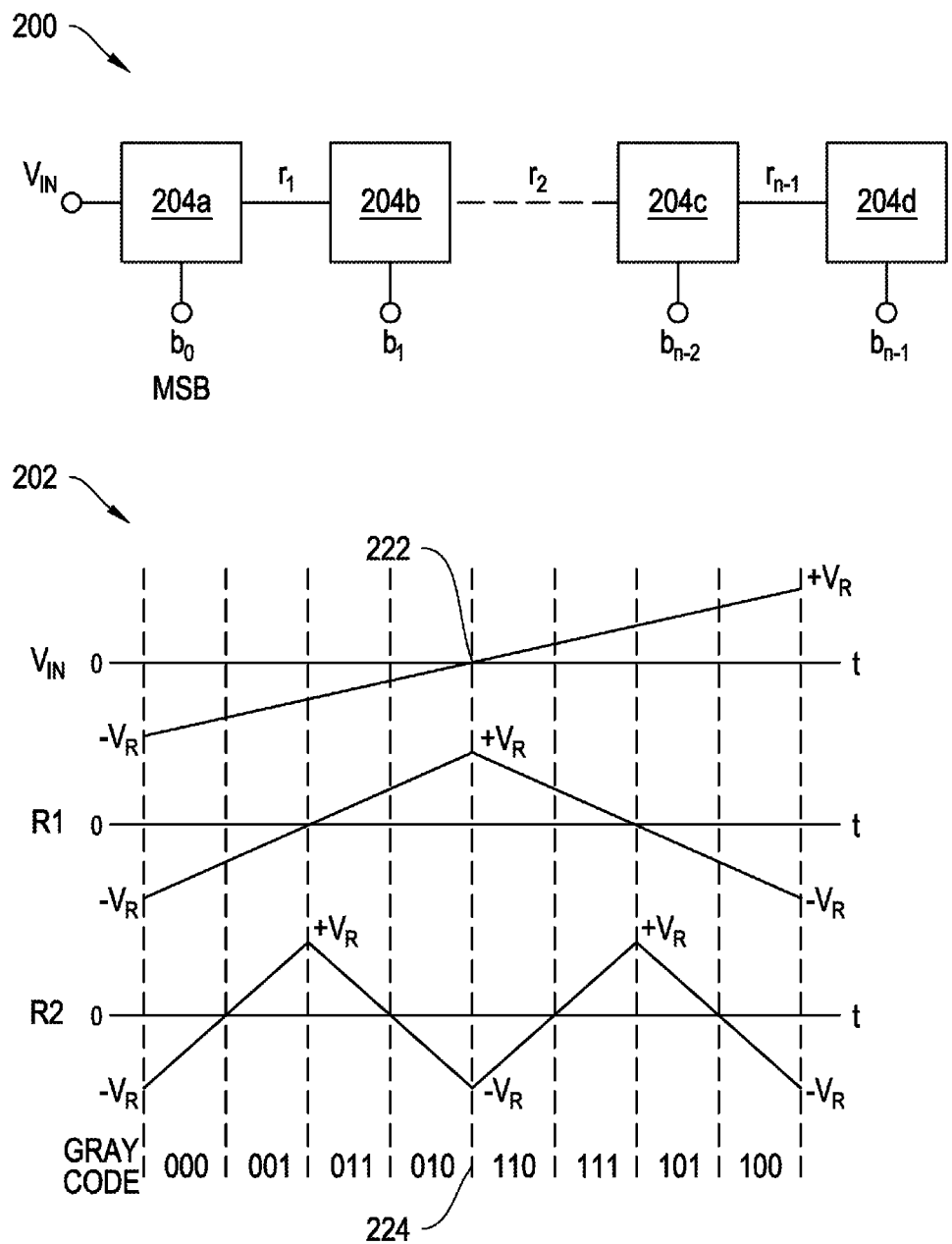
FIG. 2 shows an illustrative multistage bit-per-stage ADC and corresponding residue waveforms R1 and R2.

FIG. 2 shows an illustrative multistage bit-per-stage ADC 200 and corresponding residue waveforms R1 and R2. Multistage ADC 200 includes n stages. For clarity, only the first two and last two stages (stages 204a-d) are shown. Each stage of the multistage ADC 200 can be implemented using stage 100 from FIG. 1. A voltage input, $V_{IN}$, is applied to the input of stage 204. As in the example of FIG. 1, $V_{IN}$ is a linear ramp voltage whose range is between $-V_R$ and $+V_R$. Stage 204a applies the transfer function $R1=-2|V_{IN}|+V_R$ and outputs R1 to stage 204b. Similarly, stage 204b applies the same transfer function to R1 and outputs R2 to the next stage (not shown). As shown in graph 202, the input is effectively folded by each stage. The code that would be output by the first three stages is shown beneath R2. The code is shown in the form $b_0 b_1 b_2$. The most significant bit (MSB) of the code, the bit $b_0$ in this example, is determined by the polarity of the input. The bit $b_1$ is determined by the polarity of R1, and the bit $b_2$ is determined by the polarity of R2. For example, the code is initially 000 because the input, R1, and R2 are all negative. When R2 becomes positive, the bit $b_2$ transitions from 0 to 1, and the code is 001. When R1 becomes positive, the bit $b_1$ of the code transitions from 0 to 1, and the code is 011. If the folding process continues in subsequent stages, the code output increases by one bit per additional stage.

The code that is output by multistage ADC 200 may be Gray code. Gray code, also known as reflected binary code, is a unit distance code because successive values differ by only one bit. This unit distance property makes operation at high speeds feasible because, unlike straight binary code, there is no abrupt transition in any of the folding stage residues. Additionally, if negative and positive values are represented by Gray code, the MSB can represent the sign of a value and the remaining bits can represent the magnitude. In the example in FIG. 2, the eight Gray codes are said to be reflected about line 224 because Gray codes an equal distance from line 224 have the same lower two bits.

Figure 3:
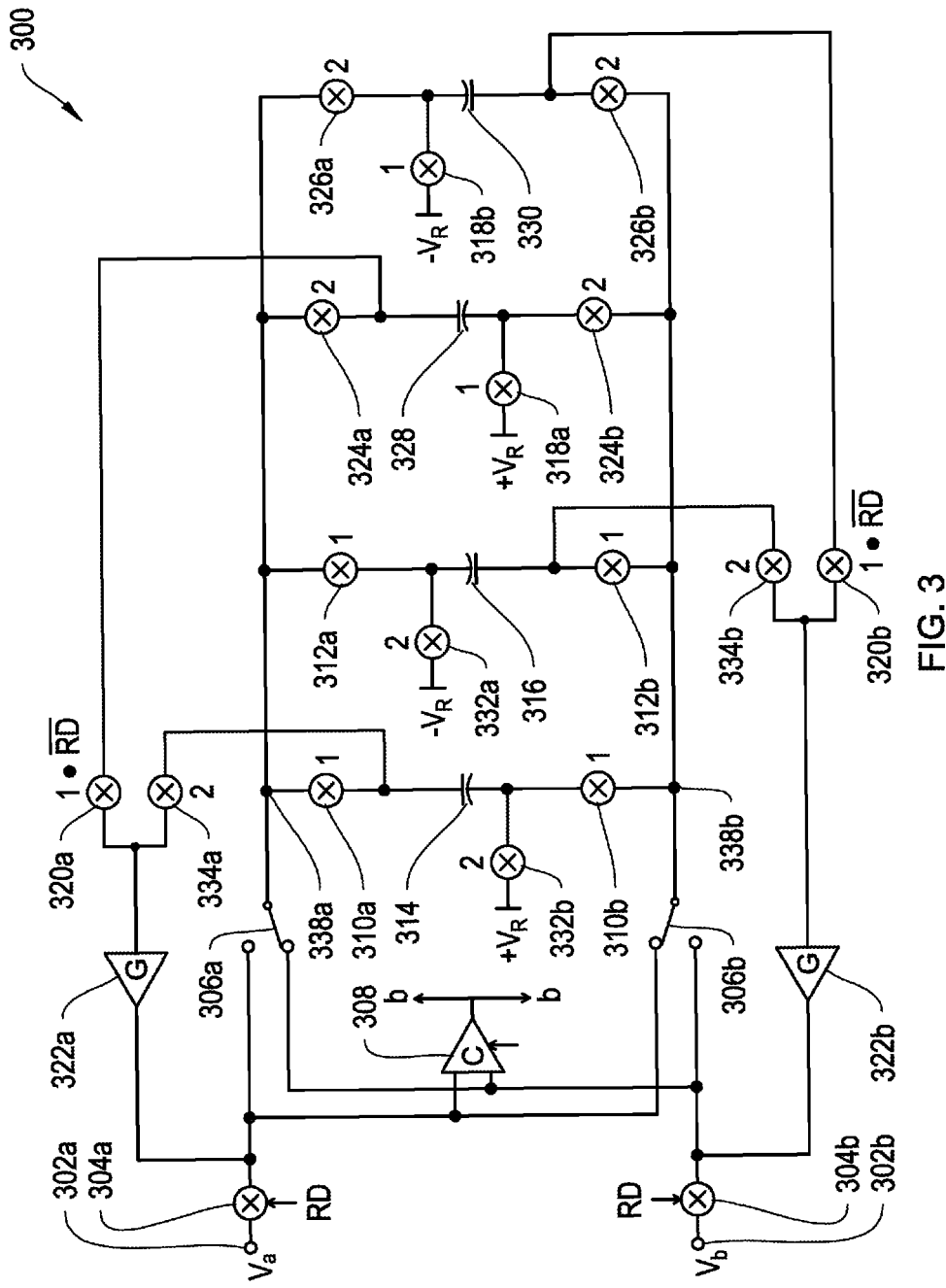
FIG. 3 shows an illustrative circuit for a variable length analog-to-digital converter.

FIG. 3 shows an illustrative circuit 300 for a variable length analog-to-digital converter. Circuit 300 includes capacitors 314, 316, 328, and 330, gates 304a-b, 310a-b, 312a-b, 318a-b, 320a-b, 324a-b, 326a-b, 332a-b, and 334a-b, switch 306a-b, buffers 332a-b, comparator 308, and interconnects. Circuit 300 implements the analog to digital conversion demonstrated in FIGS. 1 and 2. Circuit 300 operates in two stages. In stage 1, the gates labeled "1" are closed (310a-b, 312a-b, 318a-b, 320a-b). In this stage, a rectified input voltage is applied across capacitors 314 and 316, while a gain of two and a level shift is applied to the voltages stored on capacitors 328 and 330. In stage 2, the gates labeled "2" are closed (324a-b, 326a-b, 332a-b, 334a-b). In this stage, a gain of two and a level shift is applied to the voltages that were stored on capacitors 314 and 316 in stage 1, while a rectified residual signal from stage 1 is applied across capacitors 328 and 330. A read signal is used to read in a new input voltage. If the read signal is high, the gates receiving input RD (gates 304a and 304b) are closed. If the read signal is low in stage 1, gates 320a-b are also closed. The gates of circuit 300 may be switches and typically will be transistors, most commonly formed as part of a semiconductor device.

In use, a voltage input, $V_{IN}$, is applied between $V_A$ and $V_B$ at nodes 302a and 302b, respectively, such that $V_{IN}=V_A-V_B$. This voltage is a differential input centered around a common mode voltage, $V_{CM}$, such that:

$$V_A = V_{CM} + V_{IN}/2$$

$$V_B = V_{CM} - V_{IN}/2$$

Differential operation may be beneficial because of power supply noise rejection. A read signal closes gates 304a-b, thus causing the input voltage to be applied to the inputs of comparator 308. Comparator 308 determines the polarity of the input and then outputs signal b. Signal b is the first output bit of circuit 300. Signal b is also used to control switches 306a-b. Switches 306a-b together with comparator 308 function as rectifiers because they switch the polarity of the voltage between nodes 338a and 338b of the circuit 300 based on the polarity of $V_{IN}$. Since this rectification is performed by crossing the wires of a differential signal, the rectifier is essentially error free. As shown in FIG. 3, switches 306a-b are shown in the position corresponding to a positive $V_{IN}$.

In stage 1, the voltage at 338a ($V_B$) is applied to the upper plates of capacitors 314 and 316, and the voltage at 338b ($V_A$) is applied to the lower plates of capacitors 314 and 316. Because of the rectification performed by switches 306a-b, the voltage applied to the capacitors is generally $-|V_{IN}|$. Additionally, $+V_R$ is applied to capacitor 328 and $-V_R$ is applied to capacitor 330, where $+V_R$ and $-V_R$ are given by:

$$+V_R = V_{CM} + V_{SH}/2$$

$$-V_R = V_{CM} - V_{SH}/2$$

$V_{SH}$ may be equal to the half scale voltage of circuit 300.

In stage 2, +VR is applied to the bottom plate of capacitor 314 and −VR is applied to the upper plate of capacitor 316. As a result, the upper plate of capacitor 314 has a voltage given by:

$$V_B - V_A + V_R$$

And the lower plate of capacitor 316 has a voltage given by:

$$-V_R - (V_B - V_A)$$

Thus, the voltage difference between the upper plate of capacitor 314 and the lower plate of capacitor 316 is:

$$2(V_B - V_A) + V_{SH}$$

This voltage difference can be expressed more generally as:

$$-2|V_{IN}| + V_{SH}$$

which is the transfer function of the bit-per-stage converter shown in FIG. 1. This voltage difference is the residue, R1, of the first stage.

Since the gain of two and the level shift are achieved by applying reference voltages to the bottom plates of capacitors 314 and 316, the transformation is substantially error free and reduces or eliminates negative effects of the bottom-plate strays of integrated circuit (IC) capacitors. Additionally, there is no requirement or a reduced requirement for any particular capacitance for capacitors 314 and 316, or for matching of capacitances between capacitors 314 and 316. There may be small errors that depend on the absolute capacitances of capacitors 314 and 316, but they are typically second-order effects and can be reduced by trimming (e.g. by trimming the gain of buffers 332a-b) or by increasing the capacitances. Error can arise from the loading of the tops of the capacitors by stray circuit capacitance, which can slightly reduce the signal. This error can be made small by design (e.g. reducing stray circuit capacitance by minimizing the size of active devices connected to the top plates) and can be corrected by a slight adjustment of the gain of the feedback buffer amplifiers. This effect is directly reduced by increasing the capacitance of capacitors 314 and 316.

It is beneficial that the doubling and shifting functions are performed in one step because doubling the signal without shifting simultaneously could cause a signal to approach or exceed the limits of a power supply voltage. By performing these steps together, signal swing is minimized and the usable input voltage range is increased for any given supply voltage.

R1 is fed through gates 334a-b and buffers 322a-b back to the input. Buffers 322a-b apply a gain G to the residue. In certain embodiments, this gain is about one. The use of gain G instead of a unity buffer allows trimming to correct for errors. Since circuit 300 implements a recirculating design, all stages of conversion use the same buffers 322a-b and most of the limited number of error sources in circuit 300 are applied to every bit. As a result, a single linearity trim can be applied to all bits simultaneously. This property can facilitate trimming and may enable background autotrimming.

After the residue passes through buffers 322a-b, comparator 308 determines the polarity of the residue and outputs a new signal b. The new value of b is the second bit output of circuit 300 and is used to determine the state of switches 306a-b. After the switches 306a-b are set, the rectified residual is applied to the capacitors 328 and 330. Gates 310a-b and 312a-b remain open during stage 2, so the recirculated residue does not corrupt the voltages on capacitors 314 and 316.

After stage 2, stage 1 is repeated. Gates 318a-b are closed, and the voltage difference between the upper plate of capacitor 328 and the bottom plate of capacitor 330 is given by:

$$R2 = -2|R1| + V_{SH}$$

This voltage difference, R2, is fed through gates 320a-b (assuming that the read signal is low) and through buffers 322a-b back to the input. Comparator 308 determines the polarity of R2 to output the third output bit. R2 is also applied to capacitors 314 and 316.

Thus, the first cycle produces a first bit, the second cycle produces a second bit and a first residual, and the third cycle produces a third bit and a second residual. This process can continue until a new input voltage is read into circuit 300. In certain embodiments, 14 bits are extracted from the input voltage before reading a new input voltage. The circuit can produce an arbitrary number of bits by controlling the number of cycles between each reading of a new input voltage. Second and third order error effects may limit the number of accurate output bits. Since the number of output bits can be increased without increasing the number of system components, the recirculating ADC may have a smaller size than conventional ADCs.

From this example it is also apparent that there are two cells in circuit 300. The first cell includes capacitors 314 and 316, and the second cell includes capacitors 328 and 330. In the steady state, one of the cells is charging with the rectified form of the previous residual and the other cell is reading out the next residual. The two cells are thus used in alternation, each serving as the hold for the other.

In some embodiments, the level shift is achieved using the parasitic capacitors on the bottom plates of the capacitors. In these embodiments, the reference voltages $+V_R$ and $-V_R$ may be omitted. In certain embodiments, circuit 300 may operate without buffers 322a-b because the use of the gates may minimize the loading of the capacitors. Although the output of comparator 308 is Gray code, the Gray code output can be converted to straight binary code. For example, if the circuit 200 produces its Gray code output serially, MSB first, then the conversion to straight binary can be achieved by receiving the MSB unchanged, and then XORing each succeeding bit with the previous straight binary bit.

In some embodiments, circuit 300 can be implemented as a straight cascade of stages. The advantage of a straight cascade is the high throughput. In the steady state, the entire conversion takes place in two clock cycles regardless of the number of output bits. For example, if 14 bits of resolution are required, a straight cascade may have 14 times the throughput of a circulating design.

Because circuit 300 uses switches and capacitors, the circuit may have a very low temperature coefficient (e.g. less variability due to changes in operating temperature), low power consumption, and a wide clock range. While operational amplifiers have been the traditional implementation of the stages in a bit per stage converter, an implementation using switches and comparators requires less power and is more accurate because there is no dependency on component values. The capacitors used in circuit 300 do not have to be accurate, stable, or invariant with a supply voltage. The entire residue generation mechanism can be free of any first order component dependencies except for the offset of the comparator and the buffers. These offsets can be easily obtained by standard auto-zero techniques once per conversion.

Figure 4:
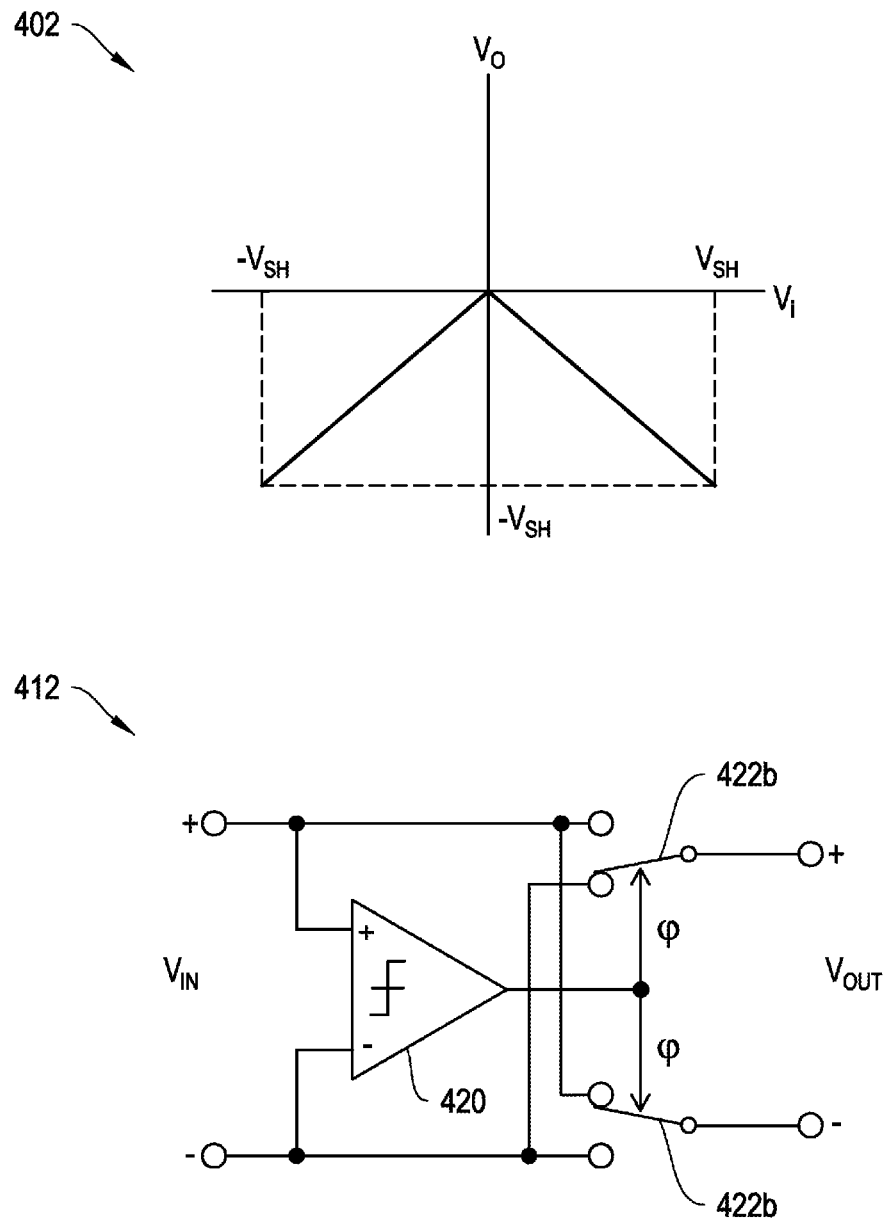
FIG. 4 shows an illustrative circuit of a bit-per-stage converter for rectifying an input signal.
Figure 5:
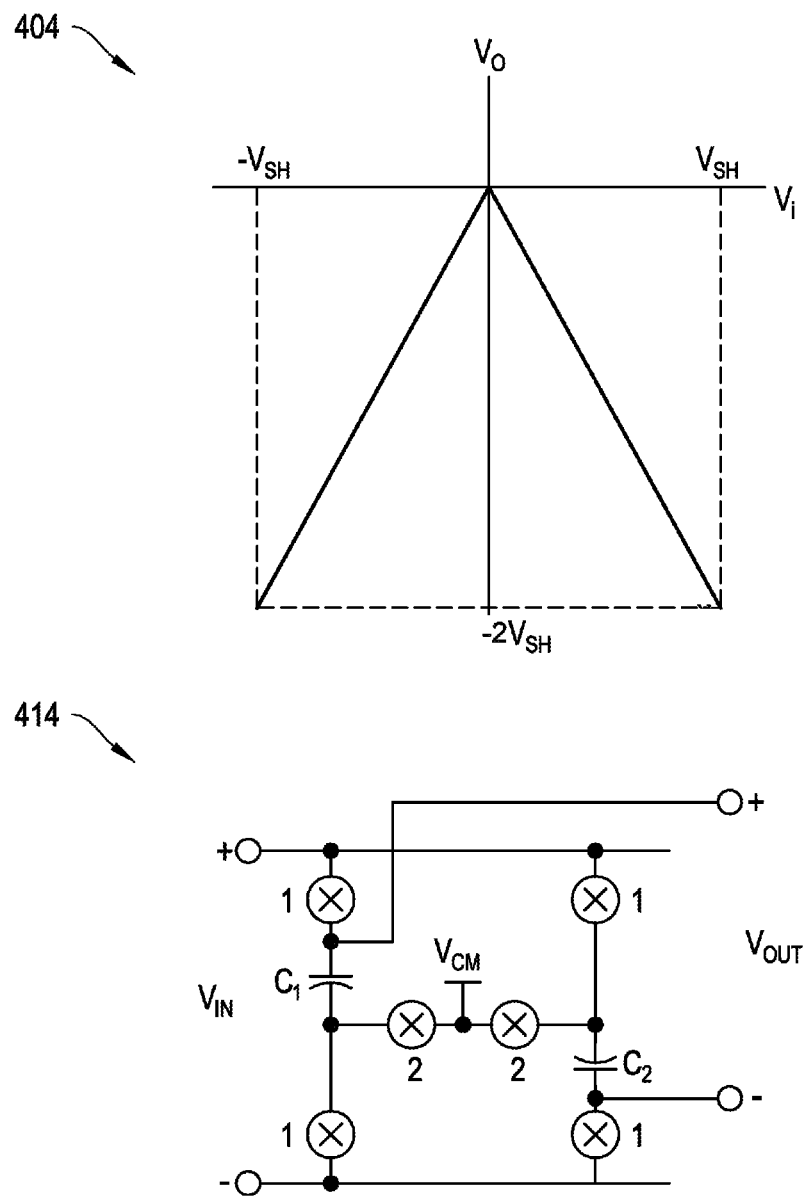
FIG. 5 shows an illustrative circuit of a bit-per-stage converter for applying a gain of two using capacitors and switches.
Figure 6:
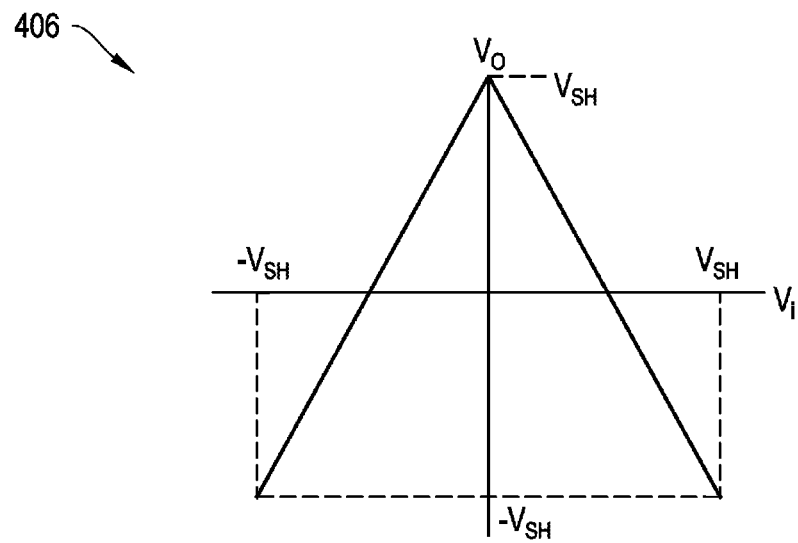
FIG. 6 shows an illustrative circuit of a bit-per-stage converter for applying a level shift.
Figure 6:
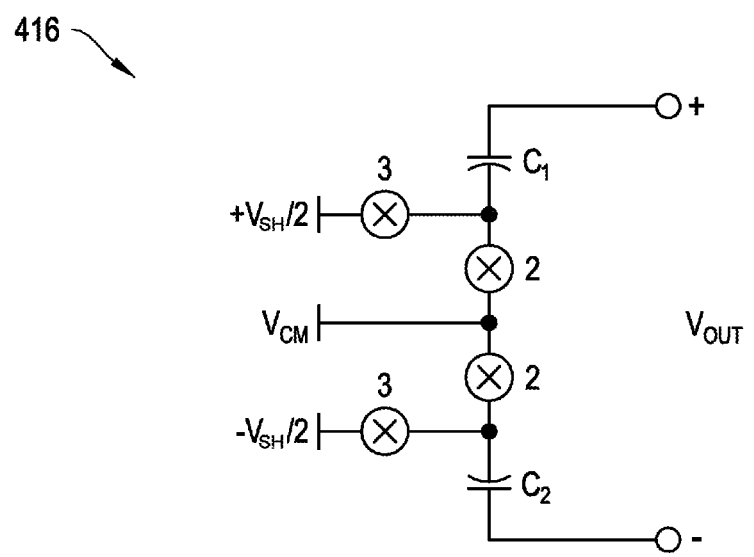

FIGS. 4-6 show illustrative transfer curves for elements of a bit-per-stage converter. FIGS. 4-6 separate the transformation performed by circuit 300 into three steps: rectification, applying a gain of two, and applying a level shift. These steps are performed by illustrative circuits 412, 414, and 416, respectively. FIG. 4 shows an illustrative circuit 412 for rectifying an input signal. Circuit 412 receives a voltage input which is applied to comparator 420. Comparator 420 determines the polarity of the input and then outputs signal φ. Signal φ is the bit output of circuit 412 and also controls the switches 422a-b so that:

$$V_{OUT} = -|V_{IN}|$$

Since this rectification is performed by crossing the wires of a differential signal, the rectifier can be substantially error free. The switches of circuit 412 are shown in a position corresponding to a positive input. The effect of circuit 412 is shown in transfer function 402.

FIG. 5 shows an illustrative circuit 414 for applying a gain of two using capacitors and switches. Circuit 414 applies a gain of two in two stages. In stage 1, the gates labeled 1 are closed and the voltage input is applied to capacitors $C_1$ and $C_2$. In stage 2, only the gates labeled 2 are closed, and capacitors $C_1$ and $C_2$ are connected in series. The output voltage, the difference in voltage between the upper plate of $C_1$ and the lower plate of $C_2$, is twice the input voltage. Thus, circuit 414 applies a gain of two to its input. A common mode voltage, $V_{CM}$, is applied between the capacitors to center of the voltage difference around $V_{CM}$. The effect of circuits 412 and 414 in series is shown in transfer function 404.

FIG. 6 shows an illustrative circuit 416 for applying a level shift. Circuit 416 applies a level shift in two stages, stage 2 and stage 3. In stage 2, the capacitors $C_1$ and $C_2$ in circuit 416 start with the voltage of capacitors $C_1$ and $C_2$ from stage 2 in circuit 414. In stage 3, the common mode voltage is disconnected because the gates labeled 2 are open. A voltage $+V_{SH}/2$ is applied to the bottom plate of capacitor c1 and a voltage $-V_{SH}/2$ is applied to the lower plate of capacitor $C_2$. Therefore, circuit 416 increases the voltage difference between the upper plate of $C_1$ and the bottom plate of $C_2$ by $V_{SH}$. The transfer function 406 shows the net effect of circuits 412, 414, and 416. It can be seen from the transfer functions that circuit 412 rectifies an input signal, circuit 414 applies a gain of two, and circuit 416 applies a level shift equal to the full-scale. The circuits 412, 414, and 416 thus illustrate the operating principles of circuit 300. The operating principles, although depicted in a recirculating design in FIG. 3, can be implemented in a variety of designs, including a cascaded multistage design.

Figure 7:
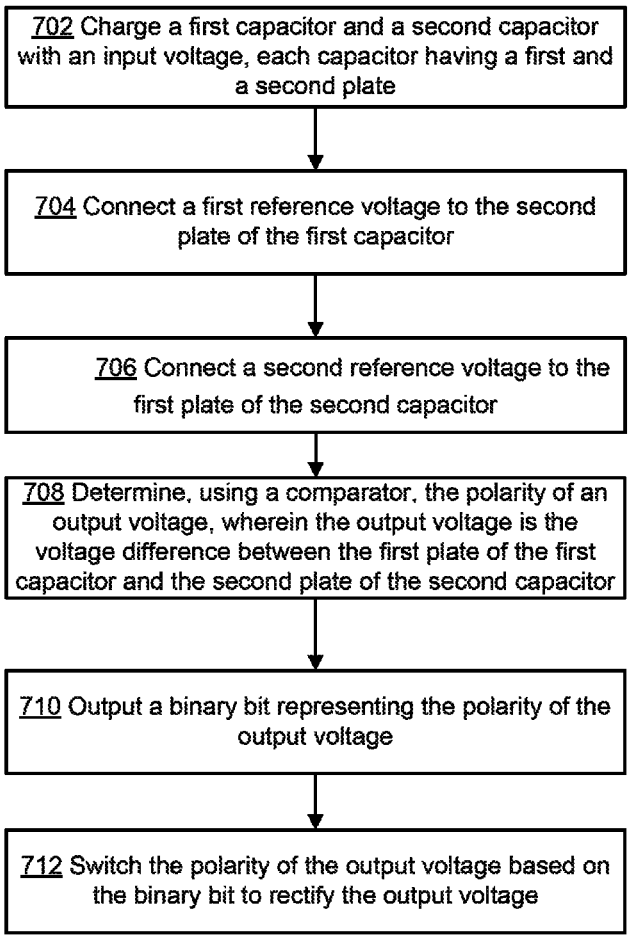
FIG. 7 shows a flowchart of an illustrative method for analog to digital conversion.

FIG. 7 shows a flowchart of an illustrative method 700 for analog to digital conversion. The method 700 extracts a bit from an analog input by determining the polarity of the input and then outputs a residue that can be used to determine subsequent bits. The method 700 can be implemented using a folding bit-per-stage architecture. For example, the method 700 can be performed using the stage 100 of FIG. 1, the multistage ADC 200 of FIG. 2, the circuit 300 of FIG. 3, or the combination of circuits 412, 414, and 416 of FIG. 4.

In step 702, a first capacitor and a second capacitor are charged with an input voltage, $V_{IN}$. Each capacitor has a first and second plate. The input voltage may be a differential input centered around a common mode voltage. Differential operation may be beneficial because of power supply noise rejection. After step 702 is performed, the first plate of each capacitor may have a potential $V_A$, and the second plate of each capacitor may have a potential $V_B$, where $V_{IN} = V_A - V_B$.

In step 704, a first reference voltage is connected to the second plate of the first capacitor, and, in step 706, a second reference voltage is connected to the first plate of the second capacitor. Connecting the capacitors in this way may double and shift the input voltage $V_{IN}$. The voltage difference between the first plate of the first capacitor and the second plate of the second capacitor may be the output voltage of a circuit. In such cases, if the first and second reference voltages are $+V_R$ and $-V_R$, respectively, then the output voltage may be $2V_{IN} + 2V_R$. Steps 704 and 706 may be simultaneous. This may be beneficial because doubling the input voltage without shifting simultaneously could cause the input voltage to approach or exceed the limits of a power supply voltage. In some embodiments, the voltage difference between the first reference and the second reference is equal to a half scale voltage so that the input voltage is shifted by a half scale.

In step 708, the polarity of the voltage difference between the first plate of the first capacitor and the second plate of the second capacitor (e.g., the polarity of the output voltage from step 706) is determined using a comparator. This determination can be performed using comparator 112 in FIG. 1, comparator 308 in FIG. 3, or comparator 720 in FIG. 4, or any suitable comparator. A binary bit representing the polarity is output in step 710. In some embodiments, a logical zero is output for negative voltages with respect to ground and a logical one is output for positive voltages with respect to ground. The binary bit may be used to control a switch to rectify the input voltage received in step 702 or the output voltage from step 706.

In step 712, the polarity of the output voltage from step 706 is switched based on the binary bit to rectify the output voltage. In some embodiments, rectification is performed by switching connections to a pair of output terminals based on the binary bit. For example, in certain embodiments, if the polarity is positive, a positive output terminal is coupled to the second plate of the second capacitor and a negative output terminal is coupled to the first plate of the first capacitor. In contrast, if the polarity is negative, the negative output terminal is coupled to the second plate of the second capacitor and the positive output terminal is coupled to the first plate of the first capacitor. The rectified voltage difference between the first plate of the first capacitor and the second plate of the second capacitor (e.g., the rectified output voltage) is a residue. In such cases, the residue output by the method 700 is given by:

$$\text{Residue} = -2|V_{IN}| + V_R$$

where $V_R$ is the voltage difference between the first and second reference voltages.

The method 700 can be repeated on the residue to extract more bits (e.g., by recirculating the residue). In some embodiments, the residue is recirculated by connecting positive and negative output terminals of a circuit to positive and negative input terminals of the same circuit. Such an implementation can allow the resolution of an ADC circuit to be variable. For example, the ADC can allow more bits to be extracted from an input by recirculating a residue for additional cycles without changing the physical structure of the circuitry. The method 700 may also be implemented using a cascading design, such as the multistage ADC 200 of FIG. 2, which provides higher throughput compared to a recirculating implementation.

The output of repeated iterations of the method 700 can produce a Gray code that represents the analog voltage input initially applied across the first and second capacitors. The most significant bit (MSB) of the Gray code can be determined by the polarity of the initial voltage input, and the subsequent bits can be determined by the polarity of subsequent residues output by successive iterations of the method 700. If negative and positive values are represented by Gray code, the MSB can represent the sign of a value and the remaining bits can represent the magnitude.

As used herein, a phrase referring to "at least one of" a list of items refers to any combination of those items, including single members. As an example, "at least one of: a, b, or c" is intended to cover: a, b, c, a-b, a-c, b-c, and a-b-c.

The foregoing description is directed to certain implementations for the purposes of describing the innovative aspects of this disclosure. However, a person having ordinary skill in the art will recognize that the teachings herein can be applied in a multitude of different ways. The described implementations may be implemented in any device, apparatus, or system including those that can be configured to sense acceleration, impact, or force. Thus, the teachings are not intended to be limited to the implementations depicted solely in the Figures, but instead have wide applicability as will be readily apparent to one having ordinary skill in the art Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will appreciate, the terms "upper" and "lower" are sometimes used for ease of describing the figures, and indicate relative positions corresponding to the orientation of the figure on a properly oriented page, and may not reflect the proper orientation of, e.g., a circuit as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described components and systems can generally be integrated together in a single circuit or incorporated into multiple circuits. Additionally, other implementations are within the scope of the following claims. In some cases, the actions recited in the claims can be performed in a different order and still achieve desirable results.

I claim:

1. A method for analog to digital conversion, comprising:
   charging a first capacitor and a second capacitor with an input voltage, each capacitor having a first and a second plate;
   connecting a first reference voltage to the second plate of the first capacitor;
   connecting a second reference voltage to the first plate of the second capacitor;
   determining, using a comparator, a polarity of an output voltage, wherein the output voltage is a voltage difference between the first plate of the first capacitor and the second plate of the second capacitor;
   outputting a binary bit representing the polarity of the output voltage; and
   switching the polarity of the output voltage based on the binary bit to rectify the output voltage.

2. The method of claim 1, wherein a first output terminal is connected to the first plate of the first capacitor and a second output terminal is connected to the second plate of the second capacitor, and
   wherein switching the polarity comprises switching connections to the first output terminal and the second output terminal based on the binary bit.

3. The method of claim 1, wherein switching the polarity comprises:
   if the polarity is positive, connecting the first output terminal to the second plate of the second capacitor and connecting the second output terminal to the first plate of the first capacitor; and
   if the polarity is negative, connecting the second output terminal to the second plate of the second capacitor and connecting the first output terminal to the first plate of the first capacitor.

4. The method of claim 1, further comprising recirculating a residue by connecting the first and second output terminals to the positive and negative input terminals.

5. The method of claim 1, wherein a voltage difference between the first reference voltage and the second reference voltage is equal to a half scale voltage.

6. The method of claim 1, wherein the step of connecting the first reference voltage to the second plate of the first capacitor and the step of connecting the second reference voltage to the first plate of the second capacitor are performed simultaneously.

7. The method of claim 4, wherein the method is repeated to extract 14 bits or more before changing the input voltage.

8. The method claim 1, wherein the input voltage is a differential voltage centered around a common mode voltage.

9. The method of claim 1, wherein the first reference voltage and the second reference voltage are supplied by a third capacitor and a fourth capacitor, respectively.

10. The method of claim 1, wherein a capacitance of the first capacitor is not equal to a capacitance of the second capacitor.

11. A system for analog to digital conversion, comprising:
    a first capacitor and a second capacitor, each capacitor having a first plate and a second plate;
    a positive input terminal and a negative input terminal, the positive and negative input terminals being configured to charge the first capacitor and the second capacitor with an input voltage;
    a first reference voltage source switchably connected to the second plate of the first capacitor;
    a second reference voltage source switchably connected to the first plate of the second capacitor;
    a comparator connected to the first plate of the first capacitor and the second plate of the second capacitor, and having a comparator output; and
    a first and a second output terminal, each terminal being switchably connected to the first plate of the first capacitor and to the second plate of the second capacitor, the switchable connections of the terminals being controlled by the comparator output.

12. The system of claim 11, wherein the switchable connections of the terminals are configured to:
if the polarity is positive, electrically couple the first output terminal to the second plate of the second capacitor and electrically couple the second output terminal to the first plate of the first capacitor; and
if the polarity is negative, electrically couple the second output terminal to the second plate of the second capacitor and electrically couple the first output terminal to the first plate of the first capacitor.

13. The system of claim 11, wherein the first and second output terminals are connected to the positive and negative input terminals, respectively.

14. The system of claim 11, wherein a voltage difference between the first reference voltage source and the second reference voltage source is equal to a half scale voltage.

15. The system of claim 11, wherein the first reference voltage source comprises a third capacitor, and the second reference voltage source comprises a fourth capacitor.

16. The system of claim 11, wherein a capacitance of the first capacitor is not equal to a capacitance of the second capacitor.

17. A system for analog to digital conversion, comprising:
a first capacitor and a second capacitor, each capacitor having a first and a second plate;
means for charging the first capacitor and the second capacitor with an input voltage;
means for connecting a first reference voltage to the second plate of the first capacitor;
means for connecting a second reference voltage to the first plate of the second capacitor;
means for determining a polarity of an output voltage, wherein the output voltage is a voltage difference between the first plate of the first capacitor and the second plate of the second capacitor;
means for outputting a binary bit representing the polarity of the output voltage; and
means for switching the polarity of the output voltage based on the binary bit to rectify the output voltage.

18. The system of claim 17, wherein the means for switching the polarity comprises means for:
if the polarity is positive, connecting the first output terminal to the second plate of the second capacitor and connecting the second output terminal to the first plate of the first capacitor; and
if the polarity is negative, connecting the second output terminal to the second plate of the second capacitor and connecting the first output terminal to the first plate of the first capacitor.

19. The system of claim 17, further comprising means for recirculating a residue by connecting the first and second output terminals to the positive and negative input terminals.

20. The system of claim 17, wherein the first reference voltage and the second reference voltage are supplied by a third capacitor and a fourth capacitor, respectively.

* * * * *